US008961920B1

(12) United States Patent
Pope, II (10) Patent No.: US 8,961,920 B1
(45) Date of Patent: Feb. 24, 2015

(54) METHODS OF ALTERING THE COLOR OF A DIAMOND BY IRRADIATION AND HIGH-PRESSURE/HIGH-TEMPERATURE PROCESSING

(75) Inventor: Louis McConkie Pope, II, Provo, UT (US)

(73) Assignee: US Synthetic Corporation, Orem, UT (US)

( * ) Notice: Subject to any disclaimer, the term of this patent is extended or adjusted under 35 U.S.C. 154(b) by 578 days.

(21) Appl. No.: 13/093,930

(22) Filed: Apr. 26, 2011

(51) Int. Cl.
*B01J 3/06* (2006.01)
*C01C 3/00* (2006.01)
*C30B 23/00* (2006.01)
*C30B 15/14* (2006.01)
*C30B 9/00* (2006.01)
*A61N 5/00* (2006.01)
*C23C 16/40* (2006.01)
*C23C 16/505* (2006.01)

(52) U.S. Cl.
CPC ............. *C23C 16/402* (2013.01); *C23C 16/505* (2013.01); *B01J 3/062* (2013.01); *B01J 2203/0655* (2013.01)
USPC .................. 423/446; 423/384; 117/88; 117/3; 117/79; 117/929; 250/492.1

(58) Field of Classification Search
None
See application file for complete search history.

(56) References Cited

U.S. PATENT DOCUMENTS

| | | |
|---|---|---|
| 2,941,241 A | 6/1960 | Strong |
| 2,941,248 A | 6/1960 | Hall |
| 2,947,611 A | 8/1960 | Bundy |
| 3,030,662 A | 4/1962 | Strong |
| 3,134,739 A | 5/1964 | Cannon |
| 3,135,007 A | 6/1964 | Howell |
| 3,141,855 A | 7/1964 | Wentorf, Jr. |
| 3,148,161 A | 9/1964 | Wentorf, Jr. et al. |
| 3,401,019 A | 9/1968 | Cowan et al. |
| 3,609,818 A | 10/1971 | Wentorf, Jr. |
| 3,767,371 A | 10/1973 | Wentorf, Jr. et al. |

(Continued)

FOREIGN PATENT DOCUMENTS

| | | |
|---|---|---|
| EP | 0014528 | 8/1980 |
| EP | 0275063 | 7/1988 |

(Continued)

OTHER PUBLICATIONS

Belimenko, L.D. et al; Soviet Physics—Doklady, vol. 26, No. 8, Aug. 1981, pp. 722, pp. 724.

(Continued)

*Primary Examiner* — Guinever Gregorio
(74) *Attorney, Agent, or Firm* — Dorsey & Whitney LLP (57) ABSTRACT

Embodiments of methods of altering the color of diamonds are disclosed. In an embodiment, a method for altering the color of diamonds includes identifying and selecting a diamond having a suitable nitrogen content, HPHT processing the selected diamond under diamond-stable conditions to alter the color of the selected diamond from a first color to a second color, irradiating the HPHT-processed diamond with an electron source having an energy between about 1 MeV and about 20 MeV so as to alter the color of the selected diamond from the second color to a third color, and annealing the irradiated diamond either under partial vacuum conditions, or under HPHT diamond-stable conditions so as to alter the color from the third color to a fourth color (e.g., pink, red, or purple, depending on the nitrogen content of the selected diamond).

40 Claims, 3 Drawing Sheets

(56) References Cited

U.S. PATENT DOCUMENTS

| | | | |
|---|---|---|---|
| 4,042,673 A | 8/1977 | Strong | |
| 4,082,185 A | 4/1978 | Strong | |
| 4,124,690 A | 11/1978 | Strong et al. | |
| 4,174,380 A | 11/1979 | Strong et al. | |
| 4,289,503 A | 9/1981 | Corrigan | |
| 4,301,134 A | 11/1981 | Strong | |
| 4,399,364 A | 8/1983 | Evans et al. | |
| 4,673,414 A | 6/1987 | Lavens et al. | |
| 4,816,286 A | 3/1989 | Hirose | |
| 4,950,463 A | 8/1990 | Satoh et al. | |
| 4,954,139 A | 9/1990 | Cerutti | |
| 6,692,714 B2 | 2/2004 | Vagarali et al. | |
| 7,172,655 B2 * | 2/2007 | Twitchen et al. | 117/2 |
| 7,241,434 B2 | 7/2007 | Anthony et al. | |
| 7,323,156 B2 * | 1/2008 | Vagarali et al. | 423/446 |
| 7,399,358 B2 | 7/2008 | Bhandari | |
| 7,404,399 B2 | 7/2008 | Sumiya et al. | |
| RE41,189 E | 4/2010 | Li et al. | |
| 2001/0031237 A1 | 10/2001 | Vagarali et al. | |
| 2002/0081260 A1 | 6/2002 | Vagarali et al. | |
| 2002/0172638 A1 | 11/2002 | Vagarali et al. | |
| 2004/0175499 A1 * | 9/2004 | Twitchen et al. | 427/249.8 |
| 2005/0196547 A1 | 9/2005 | Park et al. | |
| 2007/0053823 A1 | 3/2007 | Vins | |
| 2009/0110626 A1 * | 4/2009 | Hemley et al. | 423/446 |
| 2010/0326135 A1 * | 12/2010 | Twitchen et al. | 63/26 |
| 2010/0329961 A1 * | 12/2010 | Dhillon et al. | 423/384 |
| 2010/0329962 A1 * | 12/2010 | Twitchen et al. | 423/384 |
| 2010/0329965 A1 * | 12/2010 | Twitchen et al. | 423/446 |

FOREIGN PATENT DOCUMENTS

| | | |
|---|---|---|
| EP | 0324179 | 7/1989 |
| EP | 0615954 | 9/1994 |
| EP | 0638670 | 2/1995 |
| EP | 0668377 | 8/1995 |
| EP | 0671482 | 9/1995 |
| FR | 1316489 | 9/1961 |
| GB | 0984194 | 2/1965 |
| GB | 1541847 | 3/1979 |
| JP | 2018980 | 1/1990 |
| RU | 2237113 | 9/2004 |
| WO | WO 01/14050 | 3/2001 |

OTHER PUBLICATIONS

Borisenko, V.A., et al; Sint. Almazy-Klyuch Tekh. Prog., [Dokl. Sov. Zarub. Uch. Spets., Nauchno-Tekh. Konf. Evr. Stran., Chlenov SEV SFRYu] (1977), Meeting Date , 1974, vol. 1, pp. 53-59 (abstract).

Brozel, M.R. et al.: Proc. R. Soc. Lond. A. "Partial dissociation of nitrogen aggregates in diamond by high temperature-high pressure treatments," vol. 361, (1978) pp. 109-127.

Buerki, P.R. et al.: Diamond and Related Materials 8, "Observation of the H2 defect in gem-quality type Ia diamond," vol. 8 (1999), pp. 1061-1066.

Bursill, L.A., Glaisher, R.W. "Aggregation and dissolution of small and extended defect structure in Type Ia diamond," American Mineralogist; vol. 70, pp. 608-618, 1985.

Caveney, R.J.; "The Reciprocal Lattice Spikes in Type Ia Diamonds", Phil. Mag., vol. 18, No. 151, 1968, pp. 193-195 (Abstract).

Chrenko, R.M. et al.: "Transformation of the state of nitrogren in a diamond", Nature, vol. 270, (Nov. 10, 1977), pp. 141-144.

Clark, C.D., Davey, S.T. "Defect-induced one-photon absorption in type Ia diamonds". J. Phys. C: Solid State Phys., 17 (1984) L399-L403.

Clark, C.D., Davey, S.T. "One-phonon infrared absorption in diamond," J. Phys. C: Solid State Phys., 17 (1984) 1127-1140, Printed in Great Britain.

Collins et al.; "Color changes produced in natural brown diamonds by high-pressure, high-temperature treatment," Diamond and Related Materials 9 (2000) pp. 113-122.

Collins, A.T., "Colour Centres in Diamond," Wheatstone Physics Laboratory, King's College, London, J. Gemm., 1982, XVIII.1 pp. 37-75.

Davies, G. and Summersgill, I., "Nitrogen dependent optical properties of diamond", Diamond Res., (1973) pp. 6-15.

Evans, T., "Aggregation of Nitrogen in Diamond", published in The Properties of Natural and Synthetic Diamond, Editor J.E. Field, pp. 259-290, Academic Press, London (1992).

Evans, T. et al., "The stages of nitrogen aggregation in diamond", J. Phys. C: Solid State Phys.; vol. 14 (1981), pp. L379-L384.

Evans, T. and Rainey, P.: Proc. R. Soc. Lond. Ser. A., "Changes in the defect structure of diamond due to high temperature+high pressure treatment" vol. 344, No. 1636 (1975), pp. 111-130.

Evans, T. and Qi, Z.: Proc. R. Soc. Lond. A., "The kinetics of the aggregation of nitrogen atoms in diamond," vol. 381 (1982), pp. 159-178.

Fritsch, E.: The Nature of Color in Diamonds. In: Harlow, G.E. (Ed): The Nature of Diamonds, Cambridge Univ. Press (1998), pp. 23-47.

Gems & Gemology, "Treated-Color Yellow Diamonds With Green Graining," Lab Notes, Summer 1997, pp. 136-137.

Hopkins, Alfred. "Chapter 4—Surface Analysis" ASTM Surface Analysis, pp. 1-4 (2006).

Jackson, W.E. and Webb, Steven, "Influence of substitutional nitrogen in synthetic saw-grade diamond on crystal strength", J. Mater. Res., vol. 12, No. 6, Jun. 1997, pp. 1646-1654.

Jackson, W.E. and Webb, S.W.: "Synthetic diamond crystal strength enhancement through annealing at 50 kbar and 1500° C.", J. Mater. Res., vol. 10 (1995), pp. 1700-1709.

Jackson, W.E. and Webb, S.W.: Mat. Res. Soc. Symp. Proc. "Synthetic Diamond Strength Enhancement Through High Pressure/High Temperature Annealing", vol. 383 (1995), pp. 267-272.

Kalinin, Effect of High Temperatures on the Color Characteristics of Natural Diamonds with a Brown Tinge, Thesis at Academy of Science of the USSR, United Institute of Geology, Geophysics and Mineralogy,1991, English Translation.

Kanda, H. & Watanabe, K.; 7th European Conference on Diamond, Diamond-Like and related materials jointly with ICNDST-5, the 5th International Conference on the New Diamond Science and Technology, Turs, France, Sep. 8-13, 1996. Publication in: Diam. Related materials, vol. 6, No. 5-7, Apr. 1997, pp. 708-711.

Lawson, S.C. And Kanda, H.: J. Appl. Phys., "An annealing study of nickel point defects in high pressure synthetic diamond," vol. 73 (1993), pp. 3967-3973.

Lawson, S.C. and Kanda, H.: Diamond and Related Materials, "Nickel in Diamond: an annealing study" vol. 2 (1993), pp. 130-135.

Lenzen, G. "Diamonds and Diamond Grading," London Boston Durban Singapor Sydney Toronto Wellinton, pp. 205-212 (1983).

Melendrez, R., et al. "Afterglow, TL and IRSL in beta-irradiated HPHT type Ib synthetic diamond" Phys. Stat. Sol. (a) 203, No. 12, (2006) pp. 3167-3172.

Nikitin, A.V. et al.: Soviet Sphysics—Doklady, "The Effect of Heat and Pressure on Certain Physical Properties of Diamonds," vol. 13, No. 9, (1969), pp. 842-844.

O'Donoghue, Michael, "A Guide to Man-made Gemstones," M.A., F.G.S., F.G.A.; Colour photography by Dr. Edward Gubelin C.G., F.G.A. (1983) pp. 93-101.

Orlov, Y.L.: The Mineralogy of the Diamond, John Wiley & Sons, (1977), pp. 144-145.

Pope, Sonny. "Colored Diamonds: Cutting Edge Technologies," Suncrest Diamonds, Apr. 23, 2010; pp. 1-33.

Schmetzer, K.: Goldschmiede Zeitung, "Behandlung naturlicher Diamanten zur Reduzierrung der Gelb-oder Braunsattigung", vol. 37 (1999) pp. 47-48.

Smith, Christopher et al, "GE POL Diamonds: Before and After," Fall, 2000; pp. 192-215.

Sundance Process Overview. (2006) Sundance Diamonds. Oct. 27, 2010.

Understanding the Basics of HPHT Processing. Sundance Diamonds. 2006, pp. 1-10.

Walker, John. "Optical absorption and luminescence in diamond," Rep. Prog. Physc., vol. 42, 1979, Printed in Great Britain; pp. 1606-1659.

Wang, Wuyi, et al. "Treated-Color Pink-to-Red Diamonds from Lucent Diamonds, Inc" Gems & Gemology, Spring 2005, pp. 6-19.

Webb, S.W. And Jackson, W.E.: J. Mater. Res., "Synthetic diamond crystal strength enhancement through annealing at 50 kbar and 1500 C," vol. 10 (1995), pp. 1700-1709.

Welbourn, C, et al. "De Beers' Research Yields HPHT Secrets" Diamonds.net News Center, dated May 7, 2002.

* cited by examiner

METHODS OF ALTERING THE COLOR OF A DIAMOND BY IRRADIATION AND HIGH-PRESSURE/HIGH-TEMPERATURE PROCESSING

BACKGROUND

The value and desirability of diamonds sold in the gem and jewelry trade depend heavily on the quality characteristics of the diamond (e.g., color, cut, and clarity). One important factor in valuation is the color of the diamond. The vast majority of diamonds bought and sold in the gem and jewelry trade are colorless or exhibit a slight yellow tint, with colorless diamonds being more valuable.

Another class of diamonds exhibiting strong color characteristics comprises a very tiny fraction of the market. Such diamonds are known within the trade as "fancy" and exist in various colors, such as canary yellow, pink, blue, green, red, and purple. Such colored diamonds are rare, accounting for perhaps 1 (or less) in 10,000. As such fancy colored diamonds are rare, they can be much more valuable. For example, a 1 carat fancy colored pink diamond may be valued at $1 million or more. Other colors, such as brown, light yellow, yellow-brown, and even black exist, although such diamonds have much less value than those characterized as "fancy" colored.

Because of the great value of fancy naturally colored diamonds, there have been attempts to alter the color of natural diamonds so as to result in an altered diamond exhibiting fancy color. Such altered color diamonds can generally be differentiated from naturally fancy colored diamonds by sophisticated analysis techniques, and are valued at prices significantly lower than naturally fancy colored diamonds. Such altered color diamonds fill a demand within the market for fancy colored diamonds at a relatively lower price point.

SUMMARY

Embodiments of the invention relate to methods of altering the color of natural diamonds. The method allows select diamonds exhibiting less desirable coloring (e.g., initially brown in color) to be processed in a multi-step process so as to alter the color of the diamond to a significantly more highly-valued color (e.g., fancy pink, red, or purple). According to an embodiment, a suitable candidate diamond is first identified and selected. Diamonds suitable for processing according to the present methods may exhibit a relatively low nitrogen content of, for example, not more than about 200 parts per million ("ppm") nitrogen. Identification may be by a suitable technique, such as spectroscopy (e.g., infrared absorption spectroscopy) or other chemical analysis. Suitable diamonds exhibit undesirable coloration, such as brown.

Once a suitable diamond has been identified and selected, the selected diamond is processed under high-pressure/high-temperature ("HPHT"), which may be under diamond-stable conditions. Such processing may be performed within an HPHT press, typically at a temperature of at least about 1000° C. (e.g., about 1200° C. to about 2800° C., or about 1800° C. to about 2500° C.) and a pressure of at least about 4.0 GPa (e.g., about 5.0 GPa to about 10.0 GPa) for a sufficient time to remove at least a portion of the internal stresses present within the diamond. For example, the pressure of the HPHT process may be about 5 GPa to about 8 GPa and the temperature of the HPHT process may be about 1200° C. to about 2800° C. (e.g., about 1800° C. to about 2500° C. or about 1800° C. to about 2300° C.). Once the HPHT-processed diamond is removed from the press, a color change will have occurred. For example, an initially brown diamond may now exhibit a yellow color.

After HPHT processing, the diamond is then irradiated with electrons from an electron source. The diamond is irradiated with sufficient energy over a desired time so as to further change the color of the diamond. Typical energies may be between about 1 MeV and about 20 MeV, more typically between about 1 MeV and about 10 MeV (e.g., about 4 MeV). After irradiation, a further color change occurs. For example, a yellow diamond may now exhibit a bluish-greenish color after irradiation.

After irradiation, the diamond is then annealed to achieve the final fancy color. Annealing may be either under partial vacuum conditions, or under HPHT conditions. When annealed under partial vacuum or other relatively low pressure (e.g., or not more than about 500 kPa) that is easier to obtain, the annealing temperature may be less than about 1100° C. When annealing under HPHT conditions, the temperature and pressure are within the diamond-stable region temperatures and pressures as described above. For example, the temperature may typically be between about 1400° C. and about 1500° C. while the pressure is between about 3 GPa and about 8 GPa, between about 5 GPa and about 8 GPa, or between about 5 GPa and about 7 GPa.

The inventor has found that when processed as described above, bluish-greenish irradiated diamonds become pink, red, or purple. The lower the nitrogen content, the lighter the color. In other words, lower nitrogen content diamonds typically result in a pink fancy color, while somewhat higher nitrogen content diamonds may exhibit a red or even deep pink to purple fancy color. In an embodiment, annealing under HPHT conditions may result in a more desirable pink fancy color as compared to annealing under partial vacuum or relatively low pressure conditions, all else being equal.

Features from any of the disclosed embodiments may be used in combination with one another, without limitation. In addition, other features and advantages of the present disclosure will become apparent to those of ordinary skill in the art through consideration of the following detailed description and the accompanying drawings.

BRIEF DESCRIPTION OF THE DRAWINGS

The drawings illustrate several embodiments of the invention, wherein identical or similar reference numerals refer to identical or similar elements or features in different views or embodiments shown in the drawings.

DETAILED DESCRIPTION

I. Introduction

Embodiments of the invention relate to methods for altering the color of diamonds. The described methods are suitable for use with natural and/or man-made synthetic diamonds exhibiting certain characteristics (e.g., undesirable natural coloring, relatively low nitrogen content), which diamonds must be identified and then selected for color alteration processing. Such diamonds may be single crystal as they are to be used as jewelry and/or gems. For example, man-made synthetic diamonds may be formed by HPHT processing, chemical vapor deposition, or combinations of the foregoing. In one embodiment, the process may also be suitable with high clarity diamonds. Once a suitable diamond has been identified and selected, the selected diamond is first processed under HPHT diamond-stable conditions to relieve at least a portion of the internal stresses within the diamond crystal. After such HPHT processing, the diamond exhibits a different color than prior to HPHT processing (i.e., the diamond changes from a first color to a second color). The diamond is then irradiated with electron radiation to further change the color of the diamond (i.e., from a second color to a third color). After irradiation, the diamond is then annealed to achieve the final color (i.e., the diamond changes from a third color to a fourth color). The final color achieved may typically be characterized as "fancy" pink, red or purple, depending on the individual characteristics of the starting diamond crystal. Annealing may be performed under partial vacuum, or under HPHT conditions (e.g., HPHT diamond-stable conditions). Suitable diamonds that are thus identified and selected for treatment are thus altered from relatively undesirable initial coloring (e.g., brown) to much more desirable "fancy" colors of pink, red, or purple.

II. Diamond Types

Diamonds may be characterized by the concentration of impurities within the diamond crystal structure. Type I diamonds include nitrogen as an impurity, while type IIa diamonds include no measurable nitrogen impurities. Type Ia diamonds are the most common type of natural diamonds, and account for perhaps as much as about 92% to about 98% of natural diamonds. Type Ia diamonds are characterized by the presence of nitrogen, which may be present at concentrations that vary widely. The concentration may range from very low (e.g., near 0) up to relatively high levels (e.g., up to about 3000 ppm). Nitrogen in type Ia diamonds is distributed in small aggregates which substitute for neighboring carbon atoms within the crystal structure. The absorption spectrum of the nitrogen clusters or aggregates can cause the diamond to absorb blue light, making it appear brown, pale yellow, or nearly colorless. There are two types of type Ia diamonds, type IaA and type IaB. Many type Ia diamonds include both type IaA and type IaB material. Type IaA diamond is characterized by nitrogen atom impurities present in pairs. Type IaB diamond is characterized by nitrogen atoms in relatively large even-numbered aggregates.

Type Ib diamonds are much rarer, accounting for less than about 1% of natural diamonds. Type Ib diamonds are characterized by single nitrogen atoms dispersed throughout the diamond crystal that substitute for carbon atoms. Type IIa diamonds are also relatively rare, accounting for about 1-2% of natural diamonds. They include nitrogen as an impurity, but at levels so low that detection by standard infrared techniques is difficult. Type IIb diamonds are extremely rare, accounting for perhaps 0.1% of natural diamonds. Type IIb diamonds include boron, rather than nitrogen as an impurity, which gives them a fancy blue color. The above classification convention for diamonds is helpful in describing certain characteristics of any given diamond, although it will be understood that natural and at least to some extent man-made diamonds, exist with characteristics across a continuum rather than only within discrete categories, so that any given diamond may exhibit features of more than one type.

There also exist generally visually recognizable features associated with type I and type II diamonds. For example, type I diamonds are typically found in an octahedral form. As mentioned, type I diamonds often exhibit a pale to strong yellow hue commonly referred to as "Cape color". The Cape color is often an indication of nitrogen in the stone. In contrast, type II stones are typically found in cleavage rough. The coloring of type II stones ranges from very dark brown to the high colorless or nearly colorless grades.

Type Ia diamonds exhibiting sufficiently low nitrogen content are particularly suited for processing according to the present invention, as are type IIa diamonds, which also inherently exhibit low nitrogen content.

III. Embodiments of Methods for Changing Diamond Color

Figure 1:
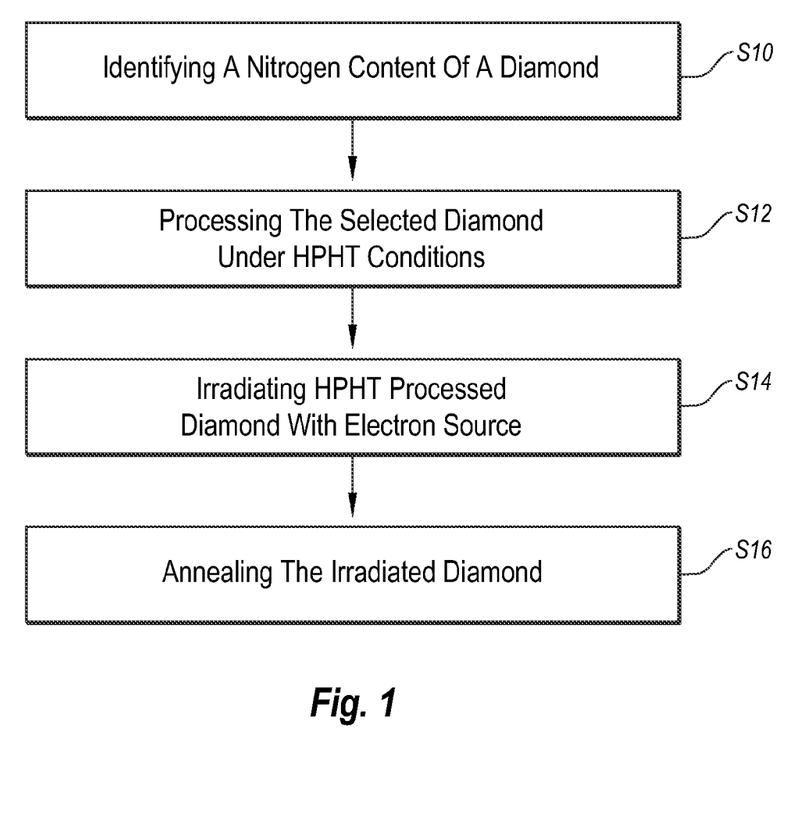
FIG. 1 is a flow diagram illustrating an embodiment of a method of altering the color of a diamond.

FIG. 1 is a flow diagram illustrating an embodiment of a method by which certain diamonds may be identified and selected for color-alteration processing, and then processed to alter their color from an initial natural color that is not desirable as for a gem quality diamond to a highly desirable "fancy" color. At S10 a suitable candidate diamond may be identified and selected. Suitable diamonds often exhibit initial natural coloring that is brown. Suitable diamonds also exhibit relatively low nitrogen content, for example, no more than about 200 ppm nitrogen, such as no more than about 50 ppm nitrogen, no more than about 40 ppm, no more than about 30 ppm, or no more than about 25 ppm. In some embodiments, when the diamond 100 is a Type IaA type, the nitrogen content may be no more than about 130 ppm. In some embodiments, when the diamond 100 is a Type IaB type, the nitrogen content may be higher, such as no more than about 200 ppm. In other embodiments, when the diamond 100 is a Type IaAB mixed type, the nitrogen content may be no more than about 150 ppm. The nitrogen content of the diamond may be measured by infrared ("IR") analysis (e.g., IR absorption spectroscopy) or other chemical analysis techniques.

Figure 2:
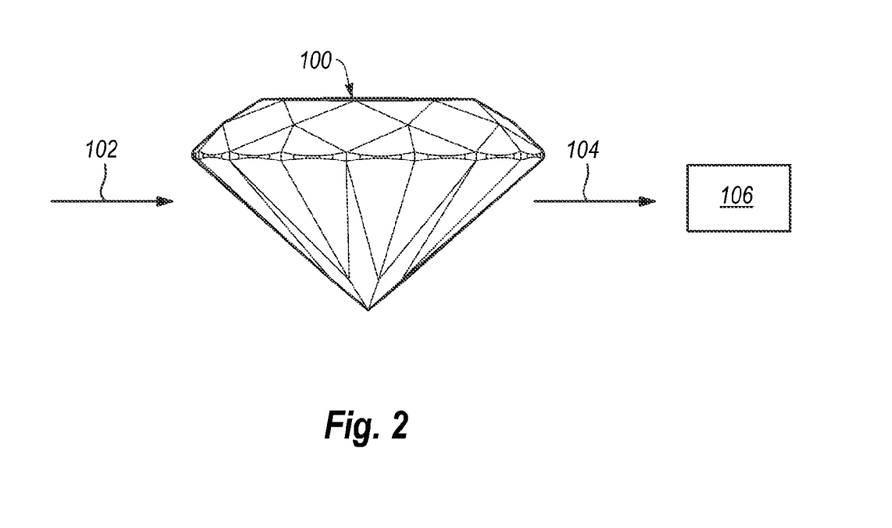
FIG. 2 is a schematic diagram illustrating IR analysis of a candidate diamond.

FIG. 2 is a schematic illustration of a diamond candidate 100. First, it may be determined whether the diamond 100 is suitable for processing by the present method in order to alter the color of the diamond. In order to be suitable, the diamond 100 should have a nitrogen content of no more than about 200 ppm nitrogen, such as not more than about 50 ppm. Any suitable technique may be used to measure the nitrogen content of diamond 100. One such method is IR absorption spectroscopy, in which the infrared spectrum of the sample (i.e., diamond 100) is recorded by passing a beam of infrared light 102 through the diamond 100. The portion of light 104 that is transmitted through diamond 100 is collected by detector 106, and examination of the transmitted light 104 reveals how much energy was absorbed at each wavelength. Absorption occurs when the frequency of the light 102 is the same as the vibrational frequency of a bond. As an example, the IR spectroscopy may be carried out using a Fourier transform infrared spectrometer ("FTIR"), which allows measurement of all infrared wavelengths substantially simultaneously. The resulting absorption spectrum shows at which IR wavelengths the diamond 100 absorbs the light 102. As will be apparent to one of skill in the art, analysis of the absorption characteristics reveals the general nitrogen content of the diamond 100, as well as whether other elements (e.g., boron) are present.

In addition to IR spectroscopy analysis to determine whether the nitrogen content is sufficiently low, the candidate diamond 100 may also be analyzed under a high-power microscope to identify any physical flaws that could potentially damage the stone during the color altering process. For example, stones including gletzes, fissures, or other cracks within the diamond can become elongated during processing. For example, such a fissure can chip out a section of the diamond or propagate through the diamond to thereby cause major breakage.

In addition to the fissures, inclusions, particularly those near the surface of the diamond, may be cause for concern. In one embodiment, the candidate diamond 100 has a clarity of very slightly included ("VS") or better. Standards associated with diamond clarity grades will be apparent to those of skill in the art. For example, VS diamonds may have minor inclusions that may be difficult for a trained grader to see under 10× magnification. The VS grade is divided into two grades, VS1 and VS2. VS2 is of a lower grade that VS1. Typically, inclusions in VS grade diamonds are invisible without magnification. Higher grades include very slightly included ("VVS"), internally flawless ("IF"), and flawless ("FL"). Lower grades include slightly included ("SI") and included ("I"). For example, slightly included grade diamonds have noticeable inclusions that are easy for a trained grader to see under 10× magnification.

As mentioned above, inclusions on or near the diamond surface are of significant concern. In some embodiments, a diamond suitable for processing may include one or more small inclusions positioned within the body of the diamond, which typically do not cause damage during processing.

Once a suitable diamond has been identified and selected at S10, at S12, the selected diamond 100 is subjected to HPHT diamond-stable conditions within an HPHT press. In one embodiment, the HPHT conditions are within the diamond-stable region. Typical HPHT processing temperatures may be at least about 1000° C. For example, the temperature may range between about 1200° and about 2800° C., or between about 1800° C. and about 2500° C. Typical HPHT pressures may be at least about 4.0 GPa. For example, the pressure may range between about 5 GPa to about 10 GPa, more typically between about 5 to about 8 GPa or about 5 to about 7 GPa. The HPHT conditions are applied for a time sufficient to relieve and/or remove at least a portion of the internal stresses present within the diamond 100, which stresses are believed to be responsible for at least a portion of the exhibited initial coloring (e.g., brown) of the diamond. As a result of such HPHT treatment, the first color of the diamond is altered to a second color (e.g., brown to yellow). This is believed to occur as A and B type nitrogen centers are broken or reconfigured into yellow visible C type nitrogen centers. The inventor has discovered that some of the selected diamonds will exhibit a "fancy" canary yellow type coloring after HPHT processing, while others of the selected diamonds are of the more common less desirable yellow shade not typically classified as "fancy".

Figure 3:
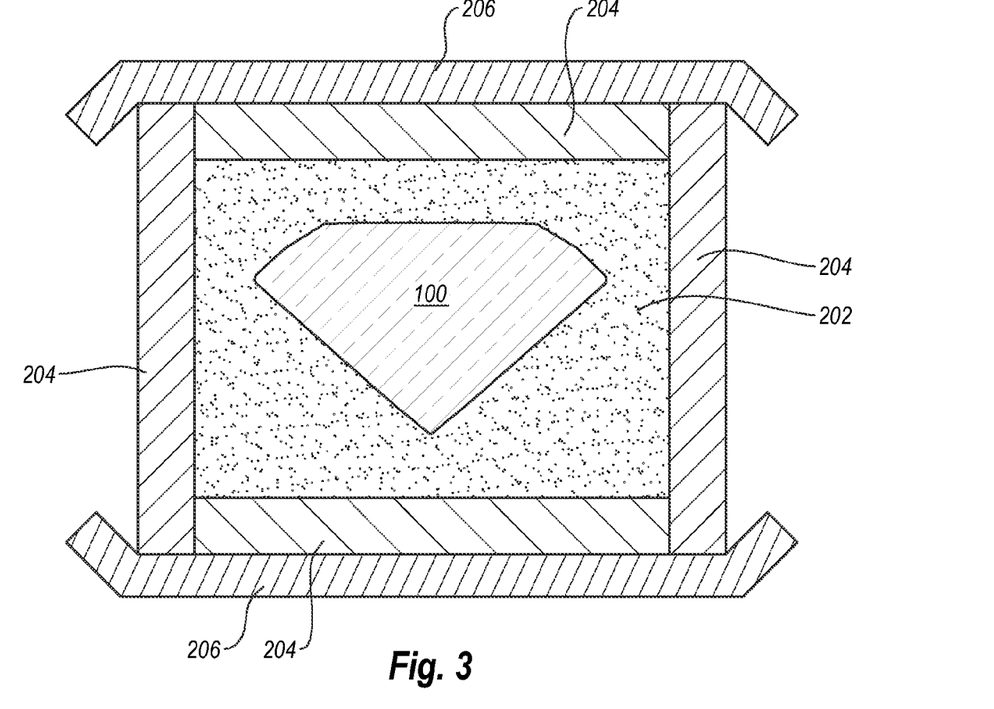
FIG. 3 is a schematic cross-sectional view of an embodiment of a support medium into which the diamond to be HPHT processed is placed.

As shown in FIG. 3, the candidate diamond 100 is placed within an internal pressure transmitting medium 202 configured to distribute pressures substantially equally over the entire diamond surface. Internal pressure transmitting medium 202 is positioned within a heat generating sleeve 204 (e.g., graphite) that may also include end caps disposed therein. The heat generating sleeve 204 may be at least partially surrounded by a refractory structure 206 (e.g., pyrophyllite) to control heat loss and to reduce potential damage to the HPHT press components. For example, the refractory structure 206 may be made from tantalum, niobium, molybdenum, alloys thereof, or another suitable material. The internal pressure transmitting medium 202 may be of any suitable configuration. For example, the internal pressure transmitting medium 202 may be a suitable support material formed by positioning the diamond 100 within the internal pressure transmitting medium 202, and then pressing with the diamond in place so that the diamond is encased. As an example, the support material may be made from sodium chloride, graphite, hexagonal boron nitride, cubic boron nitride, magnesium oxide, aluminum oxide, zinc oxide, titanium oxide, other ceramic materials (e.g., an oxide), or combinations thereof. In another embodiment, the internal pressure transmitting medium 202 is pressed without the diamond in place. Once the support material is pressed so that it adheres together to form a coherent body, a cavity is drilled or otherwise hollowed out within the internal pressure medium into which the diamond is then placed.

In one embodiment, hexagonal boron nitride is used as the material for the internal pressure transmitting medium 202. The boron nitride may be mixed with boric acid, which aids in protecting the diamond from burning during HPHT processing.

Any suitable type press may be used, for example, a belt press, a toroidal press, a cubic press, or tetrahedral press. Belt and toroidal presses apply substantially equal pressures in opposing directions to the sample. As the pistons advance, the pressures are contained within a series of rings surrounding the sample. Cubic or tetrahedral presses use several pistons to provide pressure from more directions. Cubic or tetrahedral presses distribute the applied pressure uniformly over each side (e.g., 6 sides) of the refractory structure 206. This results in the pressure being applied substantially uniformly over the entire diamond surface. In the belt or toroid type press, the pressure is first applied in only two directions. Because of this, a cubic or tetrahedral press is preferred, as application of pressure in only two directions at the beginning of the HPHT process may fracture the diamond.

As described above, HPHT processing of the diamond is believed to allow nitrogen and vacancies present within the diamond crystal lattice to reconfigure (e.g., through dissociation and/or agglomeration), which results in a color change within the diamond. For example, through HPHT processing, some type I diamonds have been observed to change from a brown or cape color to fancy intense yellow or orange colors. Some type II diamonds, e.g., type IIa diamonds, which may exhibit an initial brown color have been observed to change to colorless or near colorless. In the case of type IIa brown diamonds, it is believed that the color may be due to a misalignment of the atomic lattice, with attendant plastic deformation within the lattice. For example, cluster groups of platelets and vacancies may distort the ideal crystal structure. Upon processing at HPHT conditions, at least some of these stresses may be reduced (e.g., clusters may redistribute), allowing the atomic alignment of the lattice to relax to a point that much if not substantially all of the plastic deformation causing the brown coloration may be removed.

After HPHT processing, at S14, the HPHT-processed diamond 100' (FIG. 4) is next irradiated with an electron source having an energy between about 1 MeV and about 20 MeV (e.g., between about 1 MeV and about 10 MeV, between about 2 MeV and about 5 MeV, or about 4 MeV). The electron source, energy level, and exposure time are selected to be relatively low. As a result of irradiation, another color change occurs within the diamond. In other words, the diamond exhibits a second color (e.g., yellow) after HPHT processing and a third, different color (e.g., bluish-greenish) after irradiation for a selected period at any of the disclosed energies.

Figure 4:
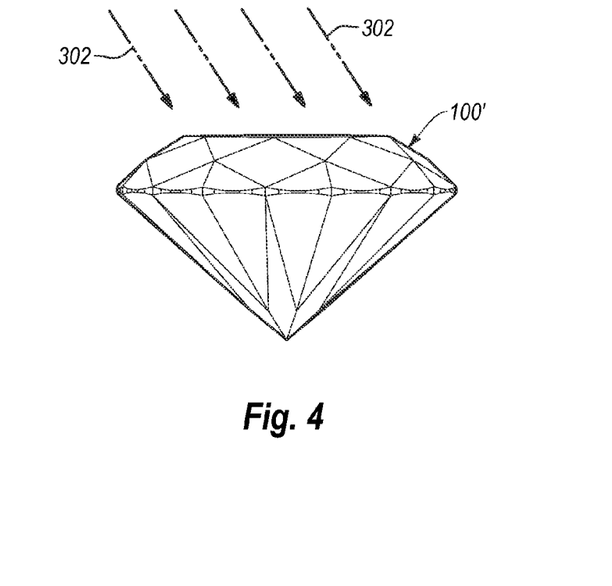
FIG. 4 is a schematic diagram illustrating electron irradiation of the HPHT-processed diamond.

FIG. 4 schematically illustrates diamond 100' being exposed to bombardment with electrons 302. Without being bound, according to one theory, bombardment with electrons may raise the overall energy and excitation state of the diamond, thereby changing the color. It is currently believed that, typically, the color change caused by electron bombardment is not stable. For this reason, the diamond 100" is further annealed, either under relatively low pressure conditions, or under HPHT conditions to result in a permanent color change.

It should be noted that in some embodiments a pre-irradiation treatment may be applied to the diamond prior to the HPHT processing in act S12. Such a pre-irradiation treatment may include irradiating the diamond with electrons or other irradiation such as ions at the same or different energy levels and times used in the act S14.

Figure 5:
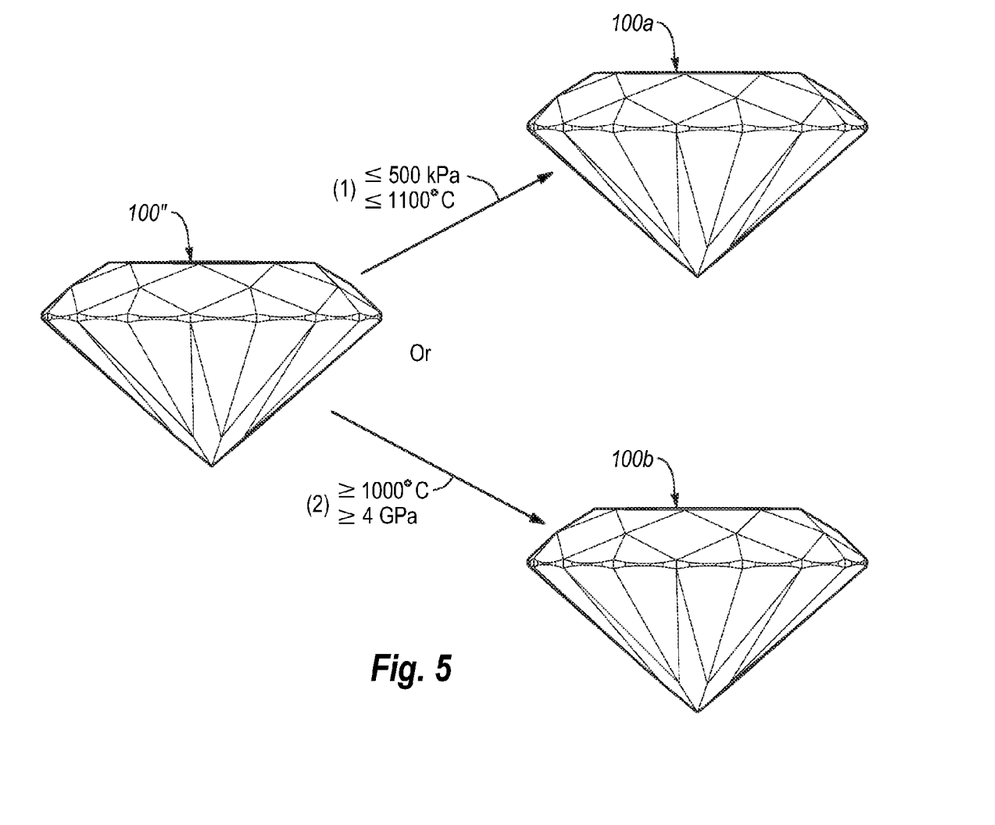
FIG. 5 is a schematic diagram illustrating embodiments of annealing pathways for obtaining a color-altered diamond.

Once irradiated, at S16, the diamond 100" is then annealed for a selected period of time to achieve the final color change to a fourth color. FIG. 5 schematically illustrates diamond 100" being annealed by either one of two embodiments: pathway (1) or pathway (2). According to pathway (1), the diamond is annealed under atmospheric or relatively low pressure (e.g., not more than about 500 kPa) and at a temperature of less than 1100° C., resulting in color-altered diamond 100a. According to pathway (2), the diamond is annealed under HPHT conditions at diamond-stable conditions (e.g., at least about 4 GPa and at least about 1000° C., more typically at least about 7 GPa and at least about 1400° C.), resulting in color-altered diamond 100b.

In an embodiment, annealing may be accomplished under partial vacuum conditions (e.g., about $10^{-7}$ torr to about $10^{-2}$ torr, or about $10^{-5}$ ton to about $10^{-3}$ ton) or other relatively low pressure (e.g., not more than about 500 kPa, more typically not more than about 400 kPa, more typically not more than about 300 kPa, more typically not more than about 200 kPa, more typically not more than about 100 kPa, more typically not more than about 50 kPa) that is easier to obtain. In one embodiment, the pressure is atmospheric pressure. When annealed under partial vacuum conditions or under relatively low pressure, the temperature is maintained during annealing at less than about 1100° C. As the pressure is increased, the annealing temperature may be decreased. For example, when annealing under vacuum or partial vacuum (i.e., below atmospheric pressure), the temperature may be between about 950° C. and about 1100° C. If annealed under atmospheric pressure (i.e., about 100 kPa), then the temperature may be about 850° C. to about 950° C. (e.g., about 900° C.).

In another embodiment, annealing may be accomplished under HPHT diamond-stable conditions. For example, at least about 1000° C. and at least about 4 GPa. According to one embodiment, HPHT annealing may be conducted between about 1400° C. and about 1600° C. (e.g., about 1500° C.) at a pressure between about 5 GPa and about 8 GPa (e.g., about 6 GPa). The lower the nitrogen content of the processed diamond, the more intense the coloring achieved. The identified and selected candidate diamonds result in processed diamonds exhibiting a generally red coloring (e.g., pink, red, or purple). The less intense colors (e.g., pink) result from diamonds having relatively lower nitrogen content, while the highest nitrogen content diamonds (e.g., ranging from about 25 ppm up to about 200 ppm) exhibit red or purple coloring.

Thus, each treatment of the diamond typically results in a color change. For example, an identified diamond 100 having a nitrogen content of about 25 ppm may be selected. The diamond 100 may exhibit a light yellow hue, "Cape color", or brown color. For example, after HPHT processing, the diamond 100' may exhibit more of a yellow color. As a further example, after irradiation, the diamond 100" may then exhibit a greenish-bluish color, and after annealing the diamond 100a or 100b exhibits a pink, red, or purple color.

While various aspects and embodiments have been disclosed herein, other aspects and embodiments are contemplated. The various aspects and embodiments disclosed herein are for purposes of illustration and are not intended to be limiting. Additionally, the words "including," "having," and variants thereof (e.g., "includes" and "has") as used herein, including the claims, are open ended and shall have the same meaning as the word "comprising" and variants thereof (e.g., "comprise" and "comprises").

What is claimed is:

1. A method of altering the color of a diamond, comprising:
   identifying a nitrogen content of a diamond that is type IaB, the diamond initially exhibiting a first color;
   processing the diamond within a high-pressure/high-temperature ("HPHT") press under diamond-stable conditions so as to alter the color of the diamond from the first color to a second color that consists of yellow;
   irradiating the diamond with electrons having an energy between about 1 MeV and about 20 MeV so as to alter the color of the diamond from the second color to a third color that consists of bluish-greenish; and
   annealing the diamond at a temperature of less than 1100° C. and under vacuum or a pressure not more than about 500 kPa so as to alter the color of the diamond from the third color to a fourth color that consists of red, pink, or purple.

2. The method of claim 1 wherein the nitrogen content is no more than about 200 μm.

3. The method of claim 1 wherein the nitrogen content is no more than about 50 μm.

4. The method of claim 1 wherein the nitrogen content is no more than about 25 μm.

5. The method of claim 1 wherein the nitrogen content is identified by infrared analysis.

6. The method of claim 1 wherein the annealing of the diamond occurs under at least partial vacuum at a temperature between about 950° C. and 1100° C.

7. The method of claim 1 wherein the annealing of the diamond occurs at about atmospheric pressure at a temperature between about 850° C. and about 950° C.

8. The method of claim 1 wherein processing the diamond within an HPHT press under diamond-stable conditions so as to alter the color of the diamond from the first color to a second color that consists of yellow includes HPHT processing the diamond at a temperature of at least about 1000° C. and a pressure of at least about 4 GPa.

9. The method of claim 1 wherein processing the diamond within an HPHT press under diamond-stable conditions so as to alter the color of the diamond from the first color to a second color that consists of yellow includes HPHT processing the diamond at a temperature between about 1800° C. and about 2500° C. and a pressure between about 5 GPa and about 10 GPa.

10. The method of claim 1 wherein processing the diamond within an HPHT press under diamond-stable conditions so as to alter the color of the diamond from the first color to a second color that consists of yellow includes HPHT processing the diamond at a temperature between about 1800° C. and about 2300° C. and a pressure between about 5 GPa and about 8 GPa.

11. The method of claim 1 wherein the diamond initially exhibits a brown color.

12. The method of claim 1 wherein during the act of processing the diamond within an HPHT press under diamond-stable conditions so as to alter the color of the diamond from the first color to a second color that consists of yellow, the diamond is positioned within an internal pressure transmitting medium, which is surrounded by a heat generating sleeve that is surrounded by an insulating material.

13. The method of claim 1 wherein the diamond comprises natural diamond.

14. The method of claim 1 wherein the diamond comprises synthetic diamond.

15. The method of claim 1 wherein irradiating the diamond comprises irradiating the diamond for a selected time period to result in the third color.

16. The method of claim 1 wherein the annealing the diamond comprises annealing the diamond for a selected time period to result in the fourth color.

17. The method of claim 1, further comprising pre-irradiating the diamond prior to HPHT processing.

18. A method of altering the color of a diamond, comprising:
identifying a nitrogen content of a diamond, the diamond initially exhibiting a first color;
processing the diamond within a high-pressure/high-temperature ("HPHT") press under diamond-stable conditions so as to alter the color of the diamond from the first color to a second color that is yellow;
irradiating the diamond with electrons having an energy between about 1 MeV and about 10 MeV so as to alter the color of the diamond from the second color to a third color that is bluish-greenish; and
annealing the diamond under HPHT diamond-stable conditions so as to alter the color of the diamond from the third color to a fourth color that consists of red, pink, or purple.

19. The method of claim 18 wherein the nitrogen content is no more than about 25 ppm.

20. The method of claim 18 wherein the annealing of the diamond occurs under a temperature between about 1400° C. and about 1500° C. and a pressure between about 5 GPa and about 8 GPa.

21. The method of claim 18 wherein during the act of processing the diamond within an HPHT press under diamond-stable conditions so as to alter the color of the diamond from the first color to a second color, the diamond is positioned within an internal pressure medium comprising hexagonal boron nitride and boric acid.

22. The method of claim 21 wherein the internal pressure transmitting medium is surrounded by a heat generating sleeve, which is in turn surrounded by an insulating material, the insulating material comprising a refractory metal.

23. The method of claim 18 wherein the nitrogen content is no more than about 200 ppm.

24. The method of claim 18 wherein the nitrogen content is no more than about 50 ppm.

25. The method of claim 18, further comprising identifying the nitrogen content by infrared analysis.

26. The method of claim 18 wherein processing the diamond within an HPHT press under diamond-stable conditions so as to alter the color of the diamond from the first color to a second color that is yellow includes HPHT processing the diamond at a temperature between about 1800° C. and about 2500° C. and a pressure between about 5 GPa and about 10 GPa.

27. The method of claim 18 wherein processing the diamond within an HPHT press under diamond-stable conditions so as to alter the color of the diamond from the first color to a second color that is yellow includes HPHT processing the diamond at a temperature between about 1800° C. and about 2300° C. and a pressure between about 5 GPa and about 8 GPa.

28. The method of claim 18 wherein the diamond initially exhibits a brown color.

29. The method of claim 18 wherein the diamond comprises natural diamond.

30. The method of claim 18 wherein the diamond comprises synthetic diamond.

31. The method of claim 18, further comprising pre-irradiating the diamond prior to HPHT processing the diamond.

32. A method of altering the color of a diamond, comprising:
identifying a diamond having a nitrogen content of no more than about 25 ppm, the diamond initially exhibiting a first color;
processing the diamond within a high-pressure/high-temperature ("HPHT") press under diamond-stable conditions at a temperature between about 1800° C. and about 2500° C. and a pressure between about 5 GPa and about 8 GPa so as to alter the color of the diamond from the first color to a second color that is yellow;
irradiating the diamond with electrons having an energy no more than about 10 MeV so as to alter the color of the diamond from the second color to a third color that is bluish-greenish; and
annealing the diamond, the annealing being at a temperature between about 1400° C. and about 1500° C. and under a pressure between about 5 GPa and about 8 GPa so as to alter the color of the diamond from the third color to a fourth color that consists of red, pink, or purple.

33. The method of claim 32, further comprising identifying the nitrogen content by infrared analysis.

34. The method of claim 32 wherein annealing of the diamond occurs under at least partial vacuum at a temperature between about 950° C. and 1100° C.

35. The method of claim 32 wherein annealing of the diamond occurs at a pressure of not more than 500 kPa and at a temperature of about 850° C. to about 950° C.

36. The method of claim 32 wherein processing the diamond within an HPHT press under diamond-stable conditions at a temperature between about 1800° C. and about 2500° C. and a pressure between about 5 GPa and about 8 GPa so as to alter the color of the diamond from the first color to a second color that is yellow includes HPHT processing the diamond at a temperature between about 1800° C. and about 2300° C.

37. The method of claim 32 wherein the diamond initially exhibits a brown color.

38. The method of claim 32 wherein the diamond comprises natural diamond.

39. The method of claim 32 wherein the diamond comprises synthetic diamond.

40. The method of claim 32, further comprising pre-irradiating the diamond prior to HPHT processing the diamond.

* * * * *

UNITED STATES PATENT AND TRADEMARK OFFICE
CERTIFICATE OF CORRECTION

| | | |
|---|---|---|
| PATENT NO. | : 8,961,920 B1 | Page 1 of 1 |
| APPLICATION NO. | : 13/093930 | |
| DATED | : February 24, 2015 | |
| INVENTOR(S) | : Pope, II | |

It is certified that error appears in the above-identified patent and that said Letters Patent is hereby corrected as shown below:

ON THE TITLE PAGE:

On Page 2, Item (56), Column 1, under "OTHER PUBLICATIONS", Line 15, delete "nitrogren" and insert -- nitrogen --, therefor.

On Page 2, Item (56), Column 2, under "OTHER PUBLICATIONS", Line 38, delete "And" and insert -- and --, therefor.

On Page 2, Item (56), Column 2, under "OTHER PUBLICATIONS", Line 44, delete "Singapor Sydney Toronto Wellinton," and insert -- Singapore Sydney Toronto Wellington, --, therefor.

On Page 2, Item (56), Column 2, under "OTHER PUBLICATIONS", Line 48, delete "Sphysics" and insert -- physics --, therefor.

IN THE CLAIMS:

In Column 8, Line 30, Claim 2, delete "200 μm." and insert -- 200 ppm. --, therefor.

In Column 8, Line 32, Claim 3, delete "50 μm." and insert -- 50 ppm. --, therefor.

In Column 8, Line 34, Claim 4, delete "25 μm." and insert -- 25 ppm. --, therefor.

Signed and Sealed this
Seventh Day of July, 2015

Michelle K. Lee
*Director of the United States Patent and Trademark Office*